(12) United States Patent  
Nikolaev et al.

(10) Patent No.: US 6,479,839 B2
(45) Date of Patent: *Nov. 12, 2002

(54) III-V COMPOUNDS SEMICONDUCTOR DEVICE WITH AN $AL_xB_yIN_zGA_{1-X-Y-Z}N$ NON CONTINUOUS QUANTUM DOT LAYER

(75) Inventors: Audrey E. Nikolaev, St. Petersburg (RU); Yuri V. Melnik, St. Petersburg (RU); Konstantin V. Vassilevski, New Castle upon Tyne (GB); Vladimir A. Dmitriev, Bethesda, MD (US)

(73) Assignee: Technologies & Devices International, Inc., Gaithersburg, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/861,180

(22) Filed: May 18, 2001

(65) Prior Publication Data

US 2002/0030192 A1 Mar. 14, 2002

Related U.S. Application Data

(60) Continuation-in-part of application No. 09/638,638, filed on Aug. 14, 2000, which is a division of application No. 09/195,217, filed on Nov. 18, 1998, now Pat. No. 6,218,269
(60) Provisional application No. 60/066,940, filed on Nov. 18, 1997.

(51) Int. Cl.[7] .............................................. H01L 27/15
(52) U.S. Cl. ........................... 257/82; 257/81; 257/84; 257/88; 257/92; 257/93; 257/98; 257/99; 257/100; 257/690; 257/698; 257/700
(58) Field of Search .................................. 257/79–103

(56) References Cited

U.S. PATENT DOCUMENTS

| | | | |
|---|---|---|---|
| 3,683,240 A | 8/1972 | Pankove | 317/234 |
| 3,819,974 A | 6/1974 | Stevenson et al. | 313/499 |
| 3,849,707 A | 11/1974 | Braslau et al. | 357/17 |
| 3,922,703 A | 11/1975 | Pankove | 357/17 |
| 4,095,331 A | 6/1978 | Rutz | 29/589 |
| 4,144,116 A | 3/1979 | Jacob et al. | 156/611 |
| 4,268,842 A | 5/1981 | Jacob et al. | 357/17 |
| 4,396,929 A | 8/1983 | Ohki et al. | 357/58 |
| 4,918,497 A | 4/1990 | Edmond | 357/17 |
| 4,966,862 A | 10/1990 | Edmond | 437/181 |
| 5,061,972 A | 10/1991 | Edmond | 357/13 |
| 5,210,051 A | 5/1993 | Carter, Jr. | 437/107 |

(List continued on next page.)

OTHER PUBLICATIONS

Maruska, H.P., et al.,"Violet Luminescence of Mg–doped GaN", Appl. Phys. Lett., vol. 22, No. 6, Mar. 15, 1973, pp. 303–305.

(List continued on next page.)

Primary Examiner—Olik Chaudhrui
Assistant Examiner—Wai-Sing Louie
(74) Attorney, Agent, or Firm—Bingham McCutchen, LLP; David G. Beck

(57) ABSTRACT

A method for fabricating p-type, i-type, and n-type III-V compound materials using HVPE techniques is provided. If desired, these materials can be grown directly onto the surface of a substrate without the inclusion of a low temperature buffer layer. By growing multiple layers of differing conductivity, a variety of different device structures can be fabricated including simple p-n homojunction and heterojunction structures as well as more complex structures in which the p-n junction, either homojunction or heterojunction, is interposed between a pair of wide band gap material layers. The provided method can also be used to fabricate a device in which a non-continuous quantum dot layer is grown within the p-n junction. The quantum dot layer is comprised of a plurality of quantum dot regions, each of which is typically between approximately 20 and 30 Angstroms per axis. The quantum dot layer is preferably comprised of $Al_xB_yIn_zGa_{1-x-y-z}N$, $InGaN_{1-a-b}P_aAs_b$, or $Al_xB_yIn_zGa_{1-x-y-z}N_{1-a-b}P_aAs_b$.

51 Claims, 9 Drawing Sheets

U.S. PATENT DOCUMENTS

| | | | |
|---|---|---|---|
| 5,243,204 A | 9/1993 | Suzuki et al. | 257/77 |
| 5,264,713 A | 11/1993 | Palmour | 257/77 |
| 5,270,554 A | 12/1993 | Palmour | 257/77 |
| 5,290,393 A | 3/1994 | Nakamura | 156/613 |
| 5,306,662 A | 4/1994 | Nakamura et al. | 437/107 |
| 5,338,994 A | 8/1994 | Edmond et al. | 257/76 |
| RE34,861 E | 2/1995 | Davis et al. | 437/100 |
| 5,387,804 A | 2/1995 | Suzuki et al. | 257/77 |
| 5,393,993 A | 2/1995 | Edmond et al. | 257/77 |
| 5,416,342 A | 5/1995 | Edmond et al. | 257/76 |
| 5,432,808 A | 7/1995 | Hatano et al. | 372/45 |
| 5,433,169 A | 7/1995 | Nakamura | 117/102 |
| 5,468,678 A | 11/1995 | Nakamura et al. | 437/107 |
| 5,506,421 A | 4/1996 | Palmour | 257/77 |
| 5,523,589 A | 6/1996 | Edmond et al | 257/77 |
| 5,539,217 A | 7/1996 | Edmond et al. | 257/77 |
| 5,563,422 A | 10/1996 | Nakamura et al. | 257/13 |
| 5,578,839 A | 11/1996 | Nakamura et al. | 257/96 |
| 5,585,648 A | 12/1996 | Tischler | 257/77 |
| 5,604,135 A | 2/1997 | Edmond et al. | 437/22 |
| 5,620,557 A | 4/1997 | Manabe et al. | 438/507 |
| 5,650,641 A | 7/1997 | Sassa et al | 257/88 |
| 5,652,434 A | 7/1997 | Nakamura et al. | 257/13 |
| 5,661,074 A | 8/1997 | Tischler | 438/32 |
| 5,679,153 A | 10/1997 | Dmitriev et al. | 117/106 |
| 5,718,760 A | 2/1998 | Carter et al. | 117/84 |
| 5,734,182 A | 3/1998 | Nakamura et al. | 257/96 |
| 5,739,554 A | 4/1998 | Edmond et al. | 257/103 |
| 5,747,832 A | 5/1998 | Nakamura et al. | 257/103 |
| 5,767,533 A | 6/1998 | Vydyanath | 257/87 |
| 5,767,581 A | 6/1998 | Nakamura et al. | 257/749 |
| 5,777,350 A | 7/1998 | Nakamura et al. | 257/96 |
| 5,831,288 A | 11/1998 | Singh et al. | 257/77 |
| 5,846,844 A | 12/1998 | Akasaki et al. | 437/21 |
| 5,874,747 A | 2/1999 | Redwing et al. | 257/77 |
| 5,877,558 A | 3/1999 | Nakamura et al. | 257/749 |
| 5,880,486 A | 3/1999 | Nakamura et al. | 257/96 |
| 5,888,886 A | 3/1999 | Sverdlov et al. | 438/505 |
| 5,959,307 A | 9/1999 | Nakamura et al. | 257/14 |
| 5,993,542 A | 11/1999 | Yanashima et al. | 117/84 |
| 6,084,899 A | 7/2000 | Shakuda | 372/45 |
| 6,115,399 A | 9/2000 | Shakuda | 372/45 |

OTHER PUBLICATIONS

Masatoshi, S., et al., "Epitaxial Growth of Undoped and Mg–Doped GaN", Japanese Journal of Appl. Physics, vol. 15, No. 10, Oct,, 1976, pp. 1943–1950.

Nakamura, S., et al., "High–Power GaN P–N Junction Blue–Light–Emitting Diodes", Japanese Journal of Appl. Physics, vol. 30, No. 12A, Dec. 1991, pp. L1999–L2001.

Akasaki, I., et al., "Photoluminescence of Mg–doped p–type GaN and electroluminescence of GaN p–n junction LED", Journal of Luminescence 48 & 49 (1991), pp. 666–670.

Nakamura, S., et al., "Highly P–Typed Mg–Doped GaN Films Grown with GaN Buffer Layers", Jpn. J. Appl. Phys., vol. 30, No. 10A, Oct., 1991, pp. L1708–L1711.

Akasaki, I., et al. "Widegap Column–III Nitride Semiconductors for UV/Blue Light Emitting Devices", J. Electrochem. Soc. vol. 141, No. 8, Aug., 1994, pp. 2266–2271.

Detchprohm, T., et al., "The homoepitaxy of GaN by metalorganic vapor phase epitaxy using GaN substrates", Journal of Crystal Growth, 137 (1994), pp. 170–174.

Khan, M.A., et al., "Violet–blue GaN homojunction light emitting diodes with rapid thermal annealed p–type layers", Appl. Phys. Lett., vol. 66, No. 16, Apr. 17, 1995, pp. 2046–2047.

Melnik, Y.V., et all, "High–guality GaN grown directly on SiC by halide vapour phase epitaxy", Inst. Phys. Conf. Ser. No. 142, Chapter 5 (1995), pp. 863–866.

Steigerwald, D., et al., "III–V Nitride Semiconductors for High–Performance Blue and Green Light–Emitting Devices", JOM, 49 (9), 1997, pp. 18–23.

Choyke, W.J., et al., "SiC—The Power Semiconductor for the $21^{st}$ Century: A Materials Perspective", Naval Research Reviews, vol. 51, No. 1, 1999, pp. 2–12.

Agarwal, A.K., et al., "SiC Power Devices", Naval Research Reviews, vol. 51, No. 1, 1999, pp. 13–23.

Morkoc, H., "GaN–Based Modulation–Doped FETs and UV Detectors", Naval Research Reviews, vol. 51, No. 1, 1999, pp. 24–43.

Linthicum, K., et al., "Recent Progress in the Growth and the Control of Defects and Electronic Properties in III–Nitride Thin Films", Naval Research Reviews, vol. 51, No. 1, 1999, pp. 44–53.

Mishra, U.K., et al., "Gallium Nitride–Based Solutions for Communications and Sensing", Naval Research Reviews, vol. 51, No. 1, 1999, pp. 54–60.

Koleske, D.D., et al. "GaN–Based Materials Growth for Microwave Electronic Device Applications", Naval Research Reviews, vol. 51 No. 1, 1999. pp. 61–71.

Bahng, W., et al. "Rapid enlargement of SiC single crystal using a cone–shaped platform", Journal of Crystal Growth, 209 (2000), pp. 767–772.

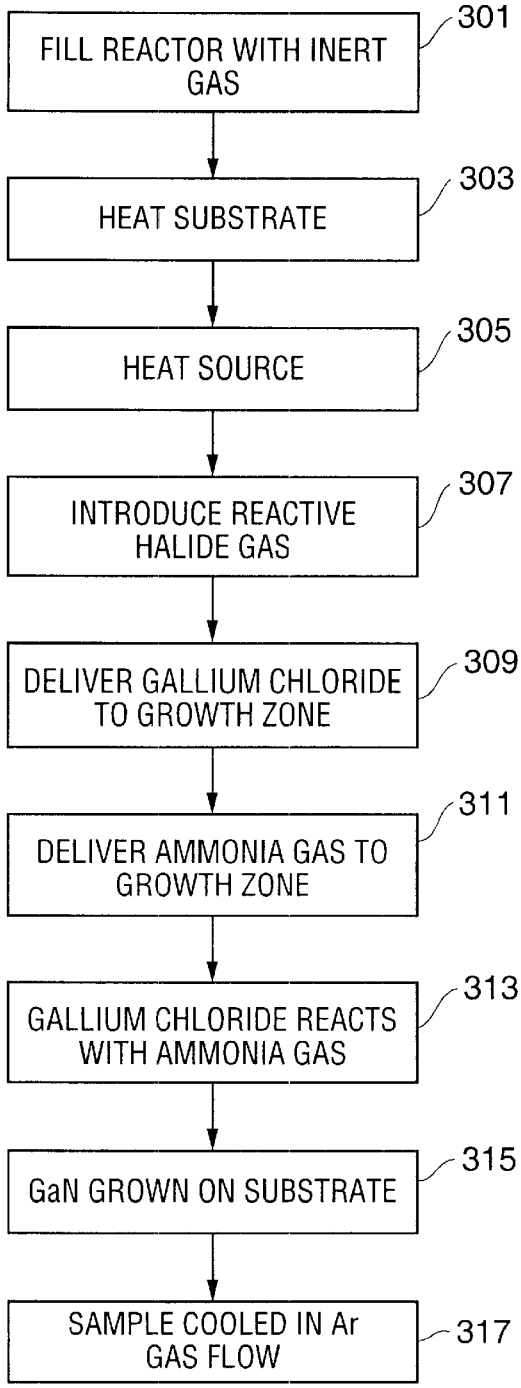
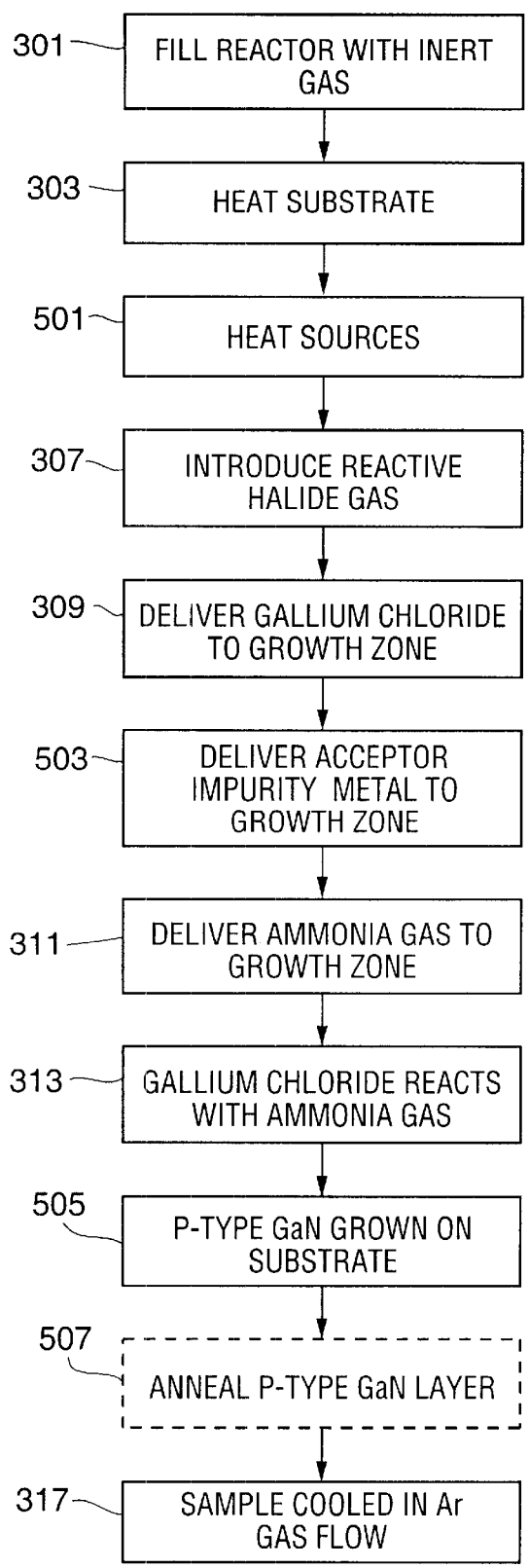
FIG. 3
FIG. 5

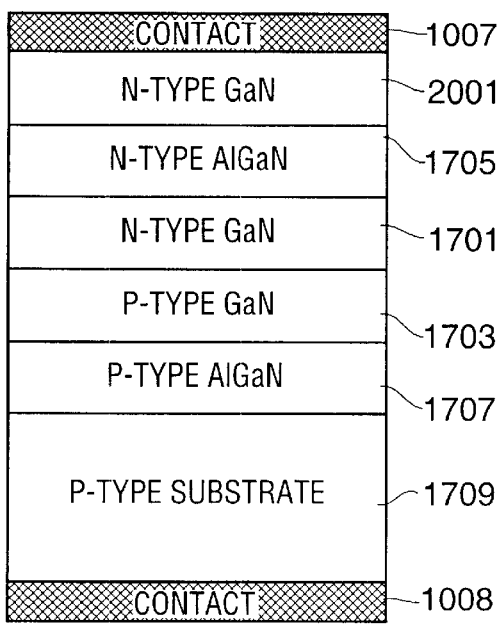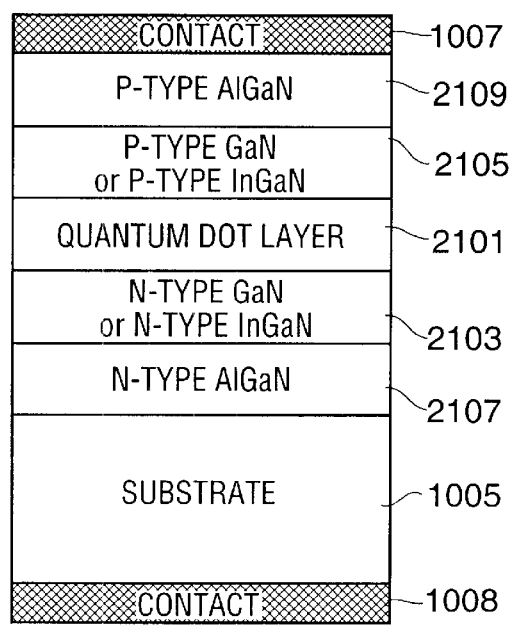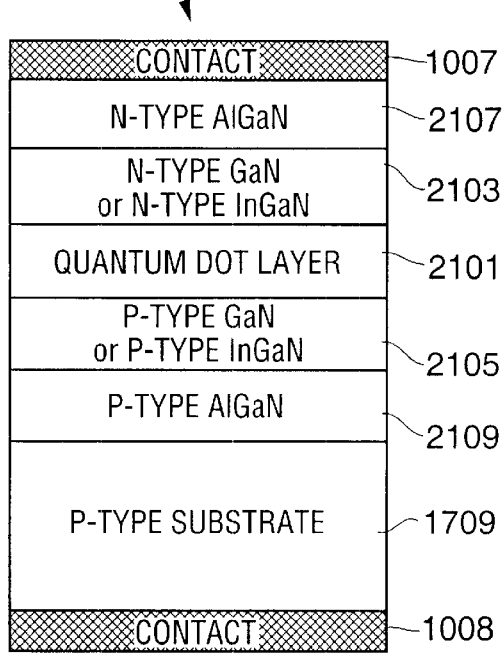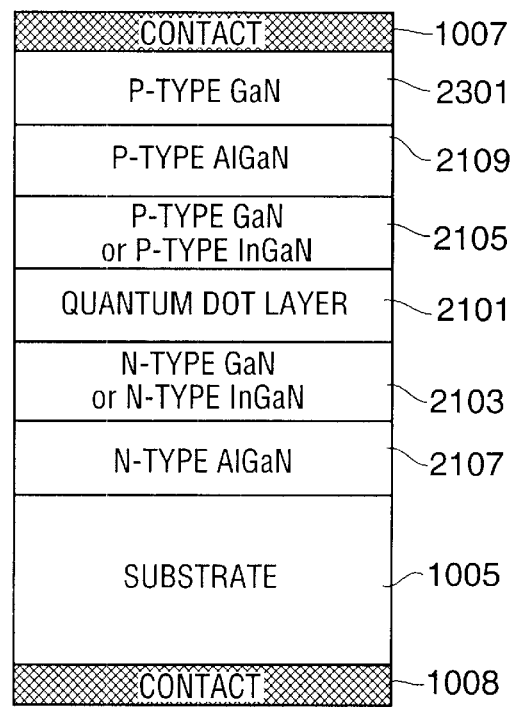

III-V COMPOUNDS SEMICONDUCTOR DEVICE WITH AN $AL_xB_yIN_zGA_{1-x-y-z}N$ NON CONTINUOUS QUANTUM DOT LAYER

CROSS-REFERENCES TO RELATED APPLICATIONS

This application is a continuation-in-part application of U.S. patent application Ser. No. 09/638,638, filed Aug. 14, 2000, which is a divisional of U.S. patent application Ser. No. 09/195,217 filed Nov. 18, 1998 now U.S. Pat. No. 6,218,262, which claims priority from U.S. patent application Ser. No. 60/066,940 filed Nov. 18, 1997, the disclosures of which are incorporated herein by reference for all purposes.

FIELD OF THE INVENTION

The present invention relates generally to semiconductor devices and, more particularly, to a method for fabricating p-n and p-i-n junction-based devices utilizing III-V compound layers as well as the structures that result from the application of the method.

BACKGROUND OF THE INVENTION

III-V compounds such as GaN, AlN, AlGaN, and InAlGaN have unique physical and electronic properties that make them ideal candidates for a variety of electronic and opto-electronic devices. In particular, these materials exhibit a direct band gap structure, high electric field breakdown, and high thermal conductivity. Additionally, materials such as $In_xAl_{1-x}GaN$ can be used to cover a wide range of band gap energies, i.e., from 1.9 eV (where x equals 1) to 6.2 eV(where x equals 0). Unfortunately, although the III-V compounds are attractive for semiconductor applications due to their physical and electronic properties, until recently the development of devices based on III-V compounds has been limited by the lack of material with suitable conductivity, specifically p-type material.

In the late 1980's, p-type GaN was grown, followed rapidly by the development of fabrication techniques for p-type AlGaN material. These materials were grown using metal organic chemical vapor deposition (MOCVD) techniques and, to a lesser extent, using molecular beam epitaxy (MBE) techniques. Since the development of p-type III-V material, a variety of semiconductor devices employing both p-n and p-i-n junctions have been demonstrated, including light emitting diodes (LEDs), laser diodes, and photodetectors.

In the MOCVD technique, III-V compounds are grown from the vapor phase using metal organic gases as sources of the Group III metals. For example, typically trimethylaluminum (TMA) is used as the aluminum source and trimethylgallium (TMG) is used as the gallium source. Ammonia is usually used as the nitrogen source. In order to control the electrical conductivity of the grown material, electrically active impurities are introduced into the reaction chamber during material growth. Undoped III-V compounds normally exhibit n-type conductivity, the value of the n-type conductivity being controlled by the introduction of a silicon impurity in the form of silane gas into the reaction chamber during growth. In order to obtain p-type material using this technique, a magnesium impurity in the form of biscyclopentadienymagnesium is introduced into the reactor chamber during the growth cycle. As Mg doped material grown by MOCVD is highly resistive, a high temperature post-growth anneal in a nitrogen atmosphere is required in order to activate the p-type conductivity.

Although the MOCVD technique has proven adequate for a variety of commercial devices, it has a number of limitations that constrain the usefulness of this approach. First, due to the complexity of the various sources (e.g., trimethylaluminum, trimethylgallium, and biscyclopentiadienylmagnesium), the process can be very expensive and one which requires relatively complex equipment. Second, the MOCVD technique does not provide for a growth rate of greater than a few microns per hour, thus requiring long growth runs. The slow growth rate is especially problematic for device structures that require thick layers such as high voltage rectifier diodes that often have a base region thickness of approximately 30 microns. Third, n-type AlGaN layers grown by MOCVD are insulating if the concentration of AlN is high (>50 mol. %). Accordingly, the concentration of AlN in the III-V compound layers forming the p-n junction is limited. Fourth, in order to grow a high-quality III-V compound material on a substrate, the MOCVD technique typically requires the growth of a low temperature buffer layer in-between the substrate and III-V compound layer. Fifth, generally in order to obtain p-type III-V material using MOCVD techniques, a post-growth annealing step is required.

Hydride vapor phase epitaxy or HVPE is another technique that has been investigated for use in the fabrication of III-V compound materials. This technique offers advantages in growth rate, simplicity and cost as well as the ability to grow a III-V compound layer directly onto a substrate without the inclusion of a low temperature buffer layer. In this technique III-V compounds are epitaxially grown on heated substrates. The metals comprising the III-V layers are transported as gaseous metal halides to the reaction zone of the HVPE reactor. Accordingly, gallium and aluminum metals are used as source materials. Due to the high growth rates associated with this technique (i.e., up to 100 microns per hour), thick III-V compound layers can be grown.

The HVPE method is convenient for mass production of semiconductor devices due to its low cost, flexibility of growth conditions, and good reproducibility. Recently, significant progress has been achieved in HVPE growth of III-V compound semiconductor materials. AlGaN and AlN layers have been grown as well as AlGaN/GaN heterostructures using this technique. The AlGaN alloys grown by HVPE have been found to be electrically conductive up to 70 mol. % of AlN. Furthermore, since this technique does not require low temperature buffer layers, diodes with n-GaN/p-SiC heterojunctions have been fabricated with HVPE.

In order to fully utilize HVPE in the development and fabrication of III-V compound semiconductor devices, p-type layers must be produced. Conventional HVPE techniques have been unable, however, to grow such material. For example, if a magnesium acceptor impurity is added to a III-V layer grown utilizing conventional HVPE techniques, the resultant material is insulating (i.e., i-type) rather than being p-type. As a result, the potential of the HVPE technique for fabricating p-n or p-i-n junction devices has not been realized.

Accordingly, what is needed in the art is a method for fabricating p-type III-V compounds using the HVPE technique. The present invention provides such a method as well as a variety of structures realizable due to the ability to fabricate p-type III-V compounds using HVPE.

SUMMARY OF THE INVENTION

The present invention provides a method for fabricating p-type, i-type, and n-type III-V compound materials using HVPE techniques. If desired, these materials can be grown directly onto the surface of a substrate without the inclusion of a low temperature buffer layer. By growing multiple layers of differing conductivity, a variety of different devices can be fabricated using the invention.

According to the invention, one or more Group III sources are located within one or more source zones of a furnace where they are heated to a suitable temperature, typically between 750° and 1050° C. The Group III sources are in the form of pure metals, e.g., gallium and aluminum, and are preferably located on or within sapphire boats. A suitable substrate such as sapphire, silicon carbide, or gallium nitride is located within the growth zone of the furnace and heated to a temperature of between 800° and 1200° C., and preferably between 1000° and 1100° C. In order to achieve material growth, the Group III source(s) is exposed to a halide reactive gas, thereby causing the formation of one or more halide metal compounds (e.g., gallium chloride, aluminum trichloride, etc.). The halide metal compound(s) is transported to the growth zone as is a reactive gas such as ammonia containing the desired Group V element. As a result of the reaction between the reactive gas and the halide metal compound(s), a layer of single crystal epitaxial III-V compound material is grown. In order to achieve p-type conductivity, one or more acceptor impurity metals are transported to the growth zone during material growth, the transport rate achieving an acceptor concentration in the range of $10^{18}$ to $10^{21}$ atoms per cubic centimeter, and preferably within the range of $10^{19}$ to $10^{20}$ atoms per cubic centimeter. Suitable acceptor impurity metals include magnesium, zinc, and magnesium-zinc alloys. Preferably the acceptor impurity metals are located on or within sapphire boats.

In at least one embodiment, the method of the invention is used to fabricate a simple p-n homojunction device. This device is comprised of an n-type III-V compound layer, e.g., GaN or AlGaN, grown directly onto the surface of a substrate without the inclusion of a low temperature buffer layer. A suitable p-type III-V compound layer is grown on the n-type layer, thus achieving the p-n homojunction. Contacts are deposited onto the structure, allowing for the conductivity of the selected substrate.

In at least one other embodiment, the method of the invention is used to fabricate a simple p-n heterojunction device, the heterojunction comprised of a GaN layer and an AlGaN layer. An example of a suitable device includes an n-type GaN layer and a p-type AlGaN layer.

In at least one other embodiment, the method of the invention is used to fabricate a double heterojunction device in which the light emitting layer is interposed between two layers, each of which has a wider band gap than the light emitting layer. As a result of the wide band gap layers, the device efficiently uses injected carriers. An example of a suitable device includes an n-type GaN layer between an n-type AlGaN layer and a p-type AlGaN layer.

In at least one other embodiment, the method of the invention is used to fabricate a device in which a p-n homojunction is interposed between layers of wide band gap material. The use of a p-n homojunction allows the device to achieve high recombination efficiencies while the surrounding wide band gap materials insure efficient use of injected carriers.

In at least one other embodiment, the method of the invention is used to fabricate a device utilizing a non-continuous quantum dot layer grown within the device's p-n junction. The quantum dot layer is comprised of a plurality of quantum dot regions, each of which is typically between approximately 20 and 30 Angstroms per axis. The quantum dot layer is preferably comprised of $Al_xB_yIn_zGa_{1-x-y-z}N$, $InGaN_{1-a-b}P_aAs_b$, or $Al_xB_yIn_zGa_{1-x-y-z}N_{1-a-b}P_aAs_b$. The p-n junction is preferably a homojunction consisting of layers of GaN or InGaN material. The p-n junction is preferably interposed between a pair of wide band gap materials.

A further understanding of the nature and advantages of the present invention may be realized by reference to the remaining portions of the specification and the drawings.

BRIEF DESCRIPTION OF THE DRAWINGS

FIG. 3 illustrates the method of growing an n-type III-V compound layer according to the invention;

FIG. 5 illustrates the method of growing a p-type III-V compound layer according to the invention;

FIG. 20 illustrates yet another alternate device comprised of a p-n homojunction interposed between a pair of wide band gap material layers;

FIG. 21 illustrates a device comprised of a non-continuous quantum dot layer within a device's p-n junction;

FIG. 22 illustrates an alternate device comprised of a non-continuous quantum dot layer within a device's p-n junction;

FIG. 23 illustrates yet another alternate device comprised of a non-continuous quantum dot layer within a device's p-n junction.

DESCRIPTION OF THE SPECIFIC EMBODIMENTS

The present invention provides a method and apparatus for producing p-type III-V nitride compound materials utilizing HVPE techniques. As a result of the ability to fabricate such p-type material, the present invention allows a variety of device structures to be realized as well.

Processes

Figure 1:
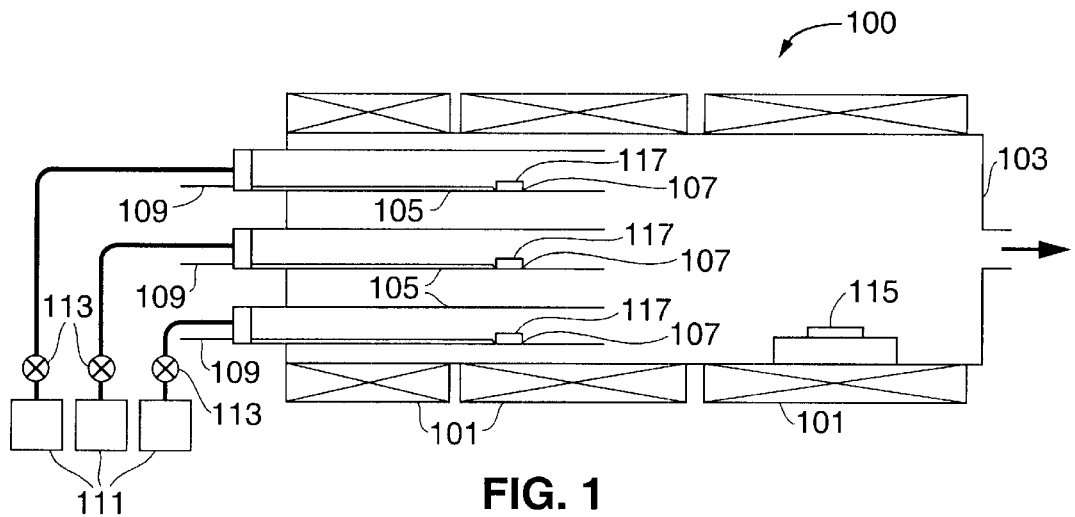
FIG. 1 is a schematic illustration of a horizontal furnace as used with the invention.

FIG. 1 is a schematic illustration of a horizontal furnace as used with the invention. It should be understood that the invention is not limited to this particular furnace configuration as other furnace configurations (e.g., vertical furnaces) that offer the required control over the temperature, temperature zones, gas flow, source location, substrate location, etc., can also be used. Furnace 100 is comprised of multiple temperature zones, preferably obtained by using multiple heaters 101, each of which at least partially surrounds furnace tube 103. Within furnace tube 103 are multiple source tubes 105. Although source tubes are used in the preferred embodiment of the invention, other means of separating the sources can be used, such as furnace partitions.

Within each source tube 105 is a source boat 107. As used herein, the term "boat" simply refers to a means of holding the source material. Therefore boat 107 may simply be a portion of a tube with an outer diameter that is slightly smaller than the inner diameter of the corresponding source tube 105. Alternately, boat 107 may be comprised of a plate of suitable material that fits within tube 105. Alternate boat configurations are known by those of skill in the art.

A control rod 109 determines the position of each boat 107 within furnace 103. Control rods 109 may be manually manipulated, as provided for in the illustrated configuration, or coupled to a robotic positioning system. Coupled to each source tube 105 is a gas source 111. The rate of gas flow through tubes 105 is controlled by valves 113 that may be manually controlled or controlled via an automated system (not shown).

A substrate 115 is located within the growth zone of furnace 103. Depending upon the desired throughput of furnace 103, substrate 115 may be either manually or automatically positioned within furnace 103. Additionally, substrates can be processed singularly or in batches. In accordance with the invention, substrate 115 may be comprised of sapphire ($Al_2O_3$), silicon carbide (SiC), gallium nitride (GaN), or other suitable single crystal material. Substrate 115 can be produced by any conventional technique.

The individual sources 117 held within boats 107 are determined by the desired composition of the layers to be grown on substrate 115. For example, to grow a III-V compound layer comprised of gallium (Ga) and nitrogen (N), Ga metal is placed within one of the source boats 107. To grow a III-V compound layer comprised of Ga, N, and aluminum (Al), Al metal is placed within a boat 107 different from that used to hold the Ga metal. To form a p-type layer of GaN, a suitable dopant such as magnesium (Mg), zinc (Zn), or a MgZn alloy, is placed within another boat 107 (i.e., different from the boats used to hold the other source materials). If multiple dopants are used, for example both Mg and Zn, the dopants may be in the form of an alloy, and thus be located within a single boat, or be in the form of individual materials, and therefore preferably located within separate boats.

Figure 2:
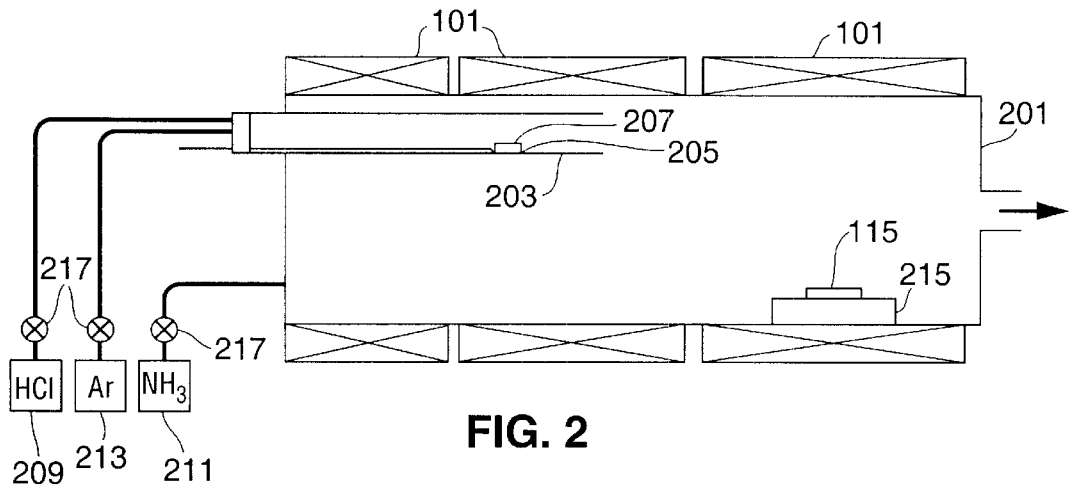
FIG. 2 is a schematic illustration of a horizontal furnace as used to grow an n-type III-V compound layer.

FIGS. 2 and 3 illustrate a specific reactor 201 and the steps used to grow an n-type III-V compound layer of GaN, respectively. Although reactor 201 is a hot-wall, horizontal reactor and the process is carried out in an inert gas flow at atmospheric pressure, as previously noted other reactor configurations can be used to perform the HVPE growth technique of the present invention. Within reactor 201 is a source tube 203, preferably comprised of quartz. A boat 205, comprised of a suitable material, contains a Ga metal source 207. Source tube 203 is coupled to a supply 209 of a halide reactive gas, preferably HCl. A source of ammonia gas 211 and a source of an inert gas such as argon (Ar) 213, are also coupled to reactor 201. Substrate 115 is preferably located on a pedestal 215, comprised of a suitable material such as quartz. Preferably the substrates are cleaned using an etching process prior to initiating any III-V compound layer growth.

Initially reactor 201 is filled with Ar gas (301). The flow of Ar gas, controlled by a metering valve 217, is in the range of 1 to 25 liters per minute. Substrate (or substrates) 115 is then heated to the desired growth temperature (step 303), preferably in the range of 800° to 1200° C., and more preferably to a temperature of between 1000° and 1100° C. As noted above, in preparation for growing III-V compound layers, typically substrate(s) 115 is etched to remove residual surface contamination, for example using gaseous HCl from supply 209. Ga source material 207 is heated to a temperature of 750° to 1050° C. (step 305). Gaseous HCl 209 is then introduced into source tube 203 (step 307), resulting in the HCl reacting with the Ga to form gallium chloride. The gallium chloride is delivered to the growth zone by the flow of Ar gas (step 309). Simultaneously, ammonia gas 211 is delivered to the growth zone (step 311). As a result of the reaction between the gallium chloride and the ammonia (step 313), a layer of single crystal epitaxial n-type GaN is grown on the surface of substrate 115 (step 315). The growth rate of the GaN ranges from 0.05 to 1 micron per minute, the rate primarily being dependent upon the flow rate of HCl. After completion of the desired layer, and assuming no additional layers are required, the flow of HCl and ammonia gas is stopped and substrate 115 is cooled in the flowing Ar gas (step 317).

Although not shown in FIGS. 2 and 3, the ratio of donors to acceptors can be further controlled by adding donor impurities to the material as the n-type layer is being grown. Suitable donor materials include, but are not limited to, oxygen (O), silicon (Si), germanium (Ge), and tin (Sn).

Figure 4:
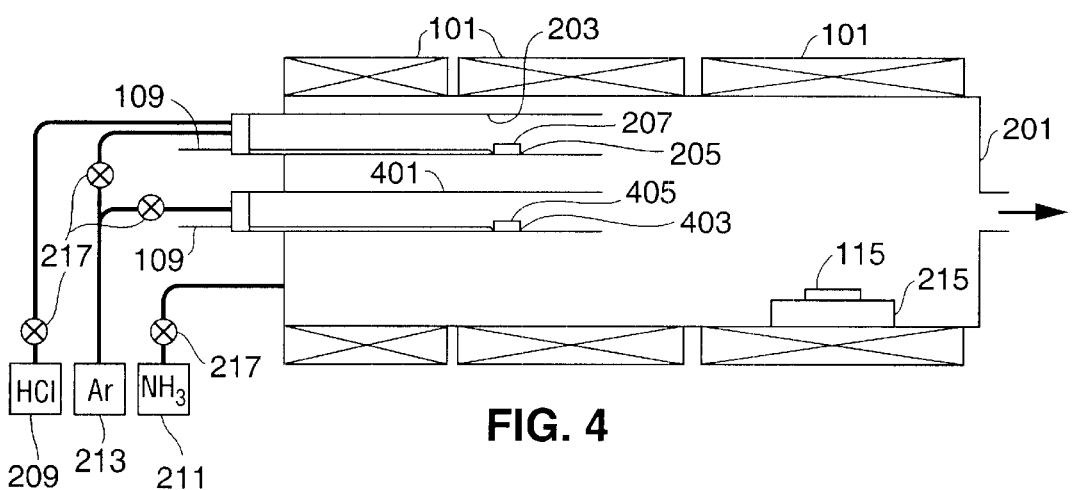
FIG. 4 is a schematic illustration of a horizontal furnace as used to grow a p-type III-V compound layer.

As illustrated in FIGS. 4 and 5, by slightly varying the apparatus shown in FIG. 2 and the process of FIG. 3, p-type GaN can be grown on the surface of substrate 115. It is understood, and is illustrated further below, that one or more layers of different composition can be interposed between substrate 115 and the p-type GaN layer.

As shown in FIG. 4, a second source tube 401 is included. A boat 403 containing an appropriate acceptor impurity metal 405 is contained within tube 401, the location of which is controlled by rod 109 as previously described. Although acceptor impurity metal can either be a pure metal (e.g., Mg or Zn) or an alloy (e.g., MgZn), it is understood that the grown III-V layer can be doped with multiple acceptor impurity metals, each of which is contained within a separate source tube.

The process used to grow the p-type GaN layer is similar to that previously described except that acceptor impurity metal 405 is introduced into the growth zone during growth of the GaN layer. As shown, source tube 401 is coupled to the inert gas supply, in this embodiment Ar gas 213. Acceptor impurity metal 405 is simultaneously heated with Ga source 207 (step 501) to a temperature in the range of 250° to 1050° C. If acceptor impurity metal 405 is comprised of Mg, preferably the temperature of the source is within the range of 450° to 700° C., more preferably within the range of 550° to 650° C., and still more preferably to a temperature of approximately 615° C. Prior to initiating growth, preferably acceptor impurity metal 405 is etched, for example using HCl gas 209, thereby insuring minimal source contamination. During growth, Ar gas is passed through source tube 401 at a relatively high flow rate, preferably between 1000 and 4000 standard cubic centimeters per minute, and more preferably between 2000 and 3500 standard cubic centimeters per minute. Due to the flow of Ar gas, atoms of the acceptor impurity metal are delivered to the growth zone (step 503) and incorporated into the GaN material growing either on substrate 115 or on a previously grown layer within the growth zone (step 505).

Although the above described process yields p-type GaN material, the inventors have found that an annealing step (step 507) can be used to further improve the properties of this layer, specifically lowering the resistivity of the p-type layer. Preferably the annealing step is performed immediately after the growth of the p-type layer is completed. In the preferred embodiment, the material is annealed for approximately 10 minutes in nitrogen at a temperature within the range of 700° to 800° C. The annealing step helps to drive the hydrogen out of the layer. It is understood that other annealing temperatures and times can used, for example, annealing at a lower temperature for an extended period of time. It is also understood, as previously described, that annealing step 507 is not required to achieve p-type III-V material according to the invention.

In addition to n-type and p-type III-V compound layers, insulating (i-type) III-V layers can be grown using the present invention. The process is similar to that described above, except that during growth of the III-V material, fewer atoms of the acceptor impurity metal are delivered to the growth zone, thereby leading to a lower doping level. If required, donor impurities can be delivered to the growth zone as well.

Figure 6:
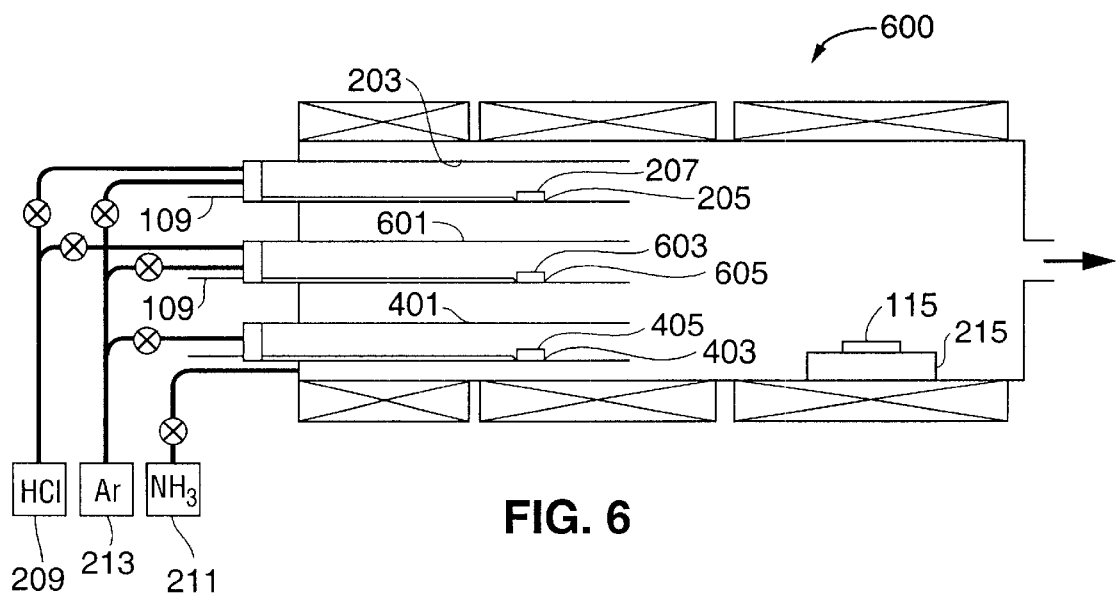
FIG. 6 is a schematic illustration of a horizontal furnace as used to grow AlGaN layers.
Figure 7:
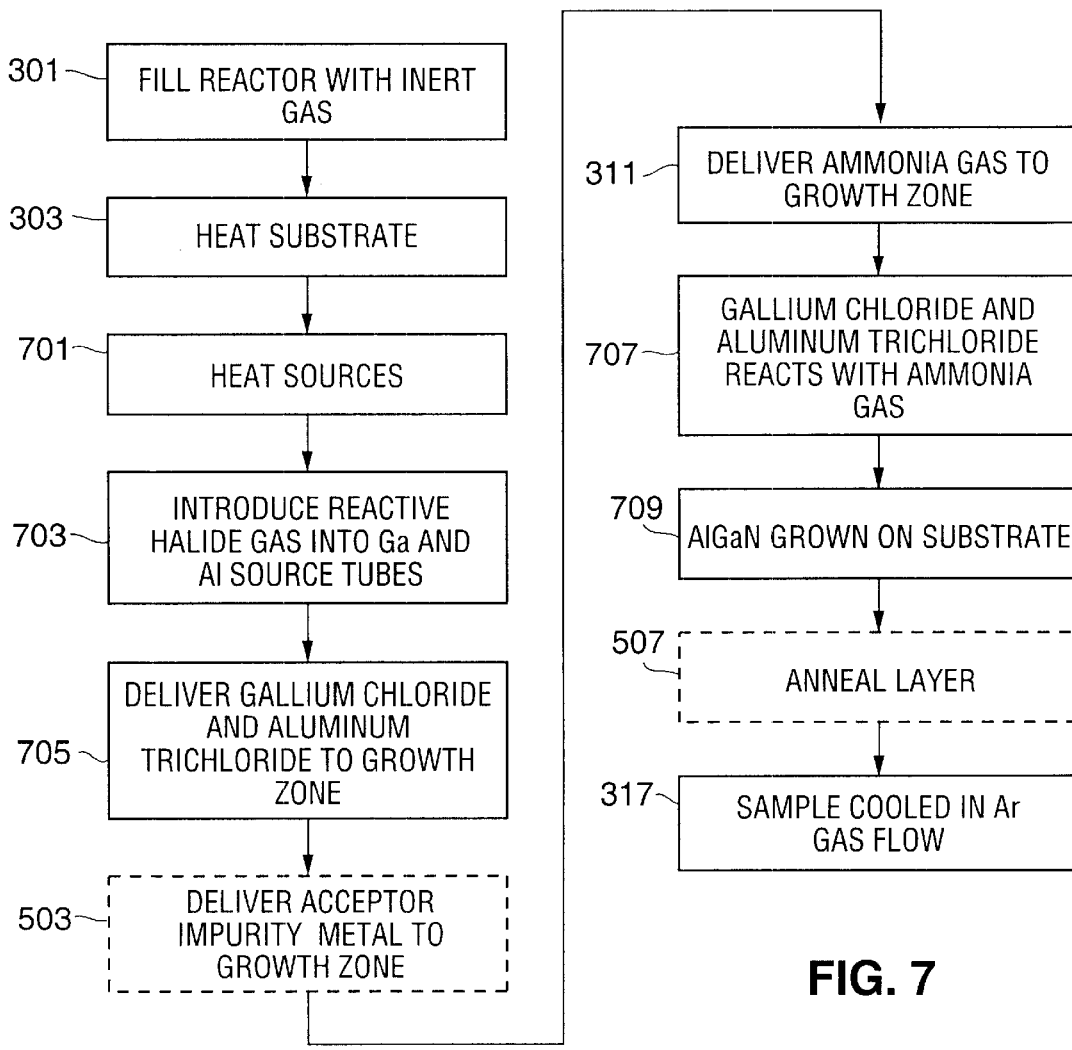
FIG. 7 illustrates the method of growing AlGaN layers according to the invention.

It is understood that although only III-V layers of GaN are described above, other III-V compound layers can be grown using the present invention. For example, an apparatus and process for growing AlGaN layers is illustrated in FIGS. 6 and 7. The illustrated reactor configuration is similar to that shown in FIG. 4 with the addition of source tube 601. Within source tube 601 is an Al source 603, contained within a boat 605. An acceptor impurity source 405 is also provided, thus allowing reactor 600 to grow AlGaN layers of n-type, i-type, or p-type simply by controlling the level of acceptor doping. It should be understood that by controlling Al source 603, reactor 600 can be used to grow GaN layers as well as AlGaN. As previously noted, controlling the level of acceptor doping allows different conductivities to be obtained for the GaN (or AlGaN) layers.

As illustrated in FIG. 7, the process used to grow AlGaN layers is quite similar to the GaN process previously described. In particular, after the reactor has been flushed and filled with inert gas (step 301), the substrate is heated (step 303) as well as all of the sources (step 701). Aluminum source 603 is heated to a temperature within the range of 700° and 850° C. Altering the position of a given source within the furnace using control rods 109 provides temperature control for that specific source. To grow an AlGaN layer, HCl gas 209 is introduced into Ga source tube 203 and Al source tube 601 (step 703), resulting in the formation of gallium chloride and aluminum trichloride which is delivered to the growth zone by the flow of Ar gas 213 (step 705). If p-type material is desired, Ar gas also flows through tube 401 containing acceptor impurity metal 405 (e.g., Mg, Zn, MgZn, etc.) (step 503, shown in phantom). Ammonia gas 211 is introduced into the growth zone (step 311) simultaneously with delivery of the source materials. As a result of the reaction between gallium chloride, aluminum trichloride, and the ammonia gas (step 707), AlGaN is grown. Depending upon the concentration, if any, of acceptor impurities, the AlGaN layer may be n-type, i-type, or p-type. If p-type material is grown, and as previously noted, an annealing step (step 507, shown in phantom) can be added to further improve the characteristics of the p-type material. In the preferred embodiment of the invention, preferably the p-type AlGaN is of the form $Al_xGa_{1-x}N$ where x is equal to 0.1. Other aluminum concentrations can be used, however, although in general the relative concentration of aluminum cannot exceed 0.2 (i.e., $Al_{0.2}Ga_{0.8}N$). As in the previous examples, the growth rate is between 0.05 and 1 micron per minute, and more typically between 0.1 and 0.5 microns per minute, the rate primarily being dependent upon HCl flow rates.

It will be understood that the descriptions provided above with respect to the growth of specific composition layers is meant to be illustrative, and not limited, of the invention. Additionally it will be understood that multiple layers of differing composition can be grown using the present invention. For example, a layer of n-type GaN can be grown followed by a layer of p-type GaN, the second layer simply requiring sufficient doping with an acceptor impurity metal during growth. Accordingly, by controlling the delivery of multiple sources to the growth zone, a multi-layer device can be grown.

Figure 8:
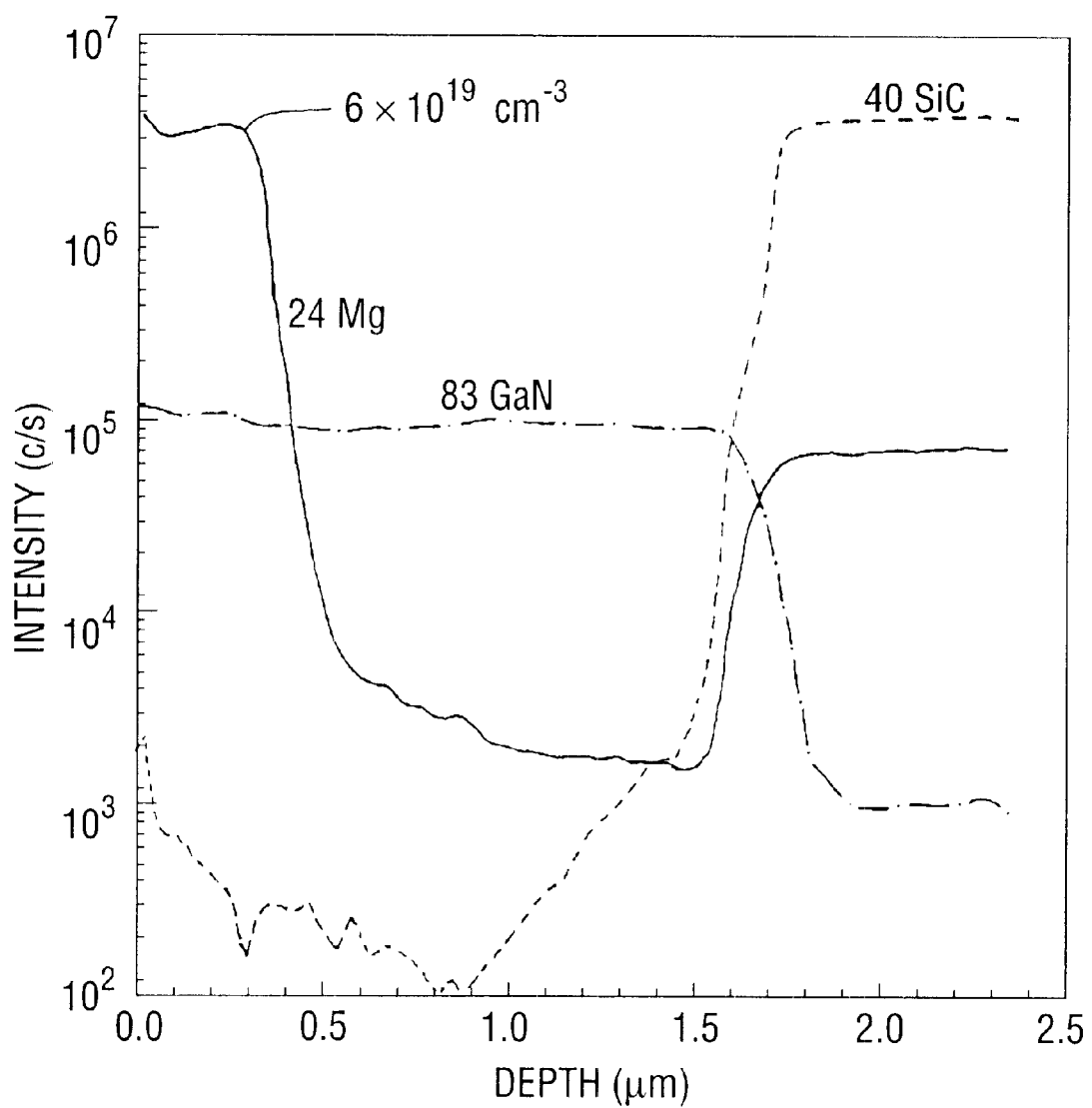
FIG. 8 illustrates the Mg atomic depth profile for a GaN p-n junction grown in accordance with the invention.

FIG. 8 shows the Mg atomic depth profile measured by secondary ion mass spectroscopy (SIMS) for a GaN p-n junction grown in accordance with the invention. The base layer of this junction was n-type GaN on top of which was grown a Mg doped p-type GaN layer. Both layers were grown in the same epitaxial run. Background electron carrier concentration in the n-type GaN layers was less than $10^{17}$ atoms per cubic centimeter.

As previously described, the level of doping controls the conductivity of the III-V compound layer. In order to achieve p-type material, it is necessary for the acceptor concentration ($N_a$) to be greater than the donor concentration ($N_d$). The inventors have found that in order to achieve the desired $N_a/N_d$ ratio and grow p-type III-V material (e.g., GaN or AlGaN), the concentration of the acceptor impurity metal (e.g., Mg) must be in the range of $10^{18}$ to $10^{21}$ atoms per cubic centimeter, and more preferably in the range of $10^{19}$ to $10^{20}$ atoms per cubic centimeter. For an i-type layer, the doping level must be decreased, typically such that the dopant concentration does not exceed $10^{19}$ atoms per cubic centimeter.

Figure 9:
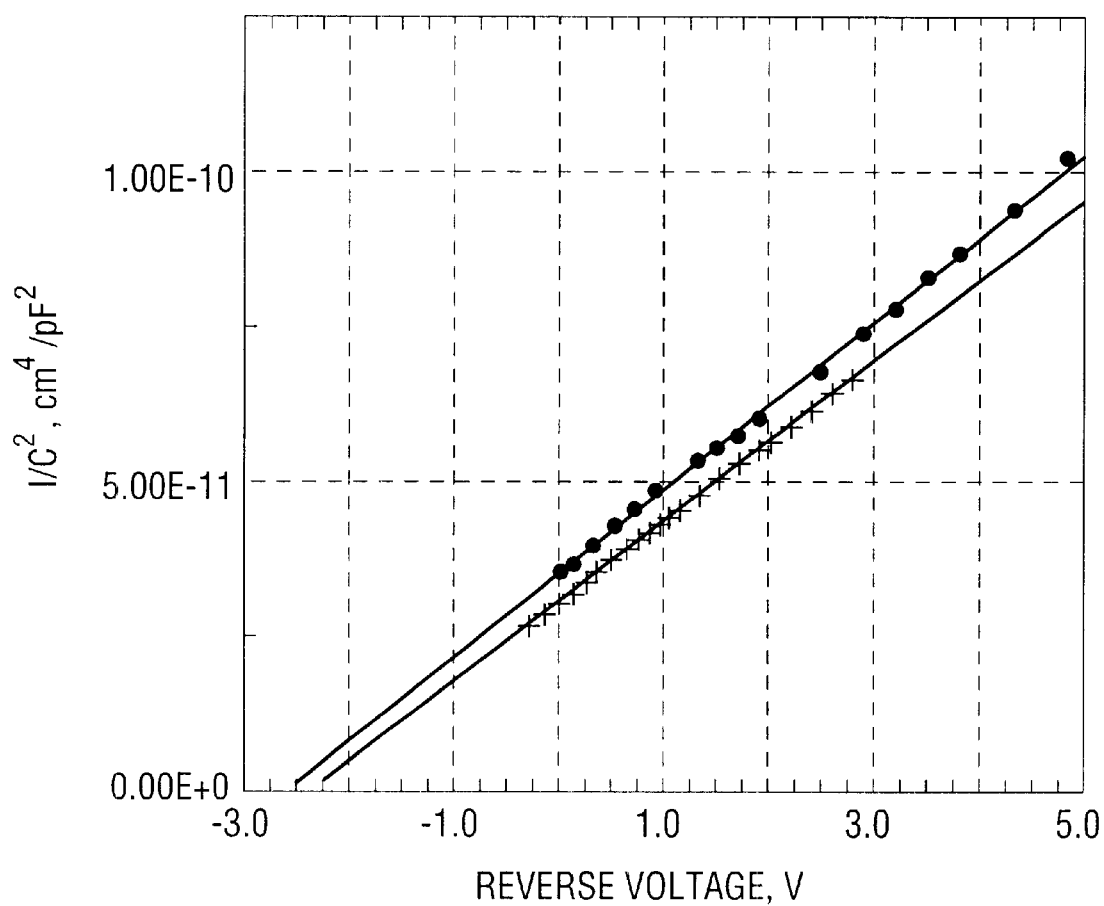
FIG. 9 illustrates C-V measurements performed on GaN p-n junctions grown in accordance with the invention.

GaN layers of both n-type and p-type grown on SiC substrates using the process of the invention were characterized by x-ray diffraction. As measured, the layers exhibited narrow x-ray rocking T)-scan curves (e.g., <150 arc sec). Additionally, the electrical characteristics of GaN p-n diodes were measured. The current densities were less than $5 \cdot 10^{-2}$ amps per square centimeter with an applied reverse voltage of up to 10 volts. The forward I-V characteristics of the GaN p-n junctions at both high and low current density were measured for various ambient temperatures. The mesa diameter was approximately $1.3 \cdot 10^{-4}$ square centimeters. The Mg concentration of the p-type GaN, measured by SIMS, was $2.5 \cdot 10^{20}$ atoms per cubic centimeter. Background donor concentration in the undoped GaN layer was approximately $1 \cdot 10^{17}$ atoms per cubic centimeter. The measured nonideality factor was 3.2, 2.8, 2.3, and 2.0 for 20° C., 70° C., 140° C., and 215° C., respectively. Accordingly, the p-n junctions operated not only at room temperature, but also at higher temperatures. The C-V measurements, illustrated in FIG. 9, were performed at a frequency of 1 MHz on mesa structures with an area of approximately $3.6 \cdot 10^{-5}$ square centimeters. As shown, the GaN p-n junctions demonstrated a voltage cut-off of about 2.5 volts.

In order to grow p-type III-V material, the inventors have found that in addition to using extremely pure source material (e.g., 99.999 to 99.9999 purity Mg) and pre-etching the material to insure minimal surface contamination, preferably the source material is contained within a sapphire boat. It is believed that the sapphire boat aids in the suppression of donors, for example arising from oxygen, within the as-grown layer. The suppression of donors may be due to the elimination of boat/source reactions resulting from the use of a sapphire boat. The inventors have also found that in order to grow p-type AlGaN material, the aluminum source material is preferably contained within a silicon carbide boat. Additionally, in the preferred embodiment of the invention, sapphire boats are used with all of the other sources, thereby insuring minimal donor contamination.

In addition to requiring the use of non-reactive boats, e.g., sapphire boats in the preferred embodiment, and specific acceptor impurity source temperatures, e.g., preferably within the range of 450 to 700° C. for Mg, and more preferably within the range of 550 to 650° C. for Mg, reactor pre-conditioning has been found to be beneficial, and in some instances required, in order to obtain p-type III-V compound growth. Specifically, the inventors have found that using a conventional horizontal reactor under typical conditions, the reactor and source tubes must be pre-conditioned by saturating them with a sufficient quantity of acceptor impurity materials prior to growing p-type III-V compound materials. The pre-conditioning process may be accomplished by performing multiple conventional acceptor impurity doping runs until the reactor tube and the source tubes are sufficiently saturated. Alternately, one or two high saturation doping runs may be performed in which a large quantity of the acceptor impurity is forced to flow through the source tube and the reactor.

In addition to finding that reactor pre-conditioning is necessary under certain circumstances, the inventors have also found that if the reactor and the source tubes become too saturated with the acceptor impurity, it may no longer be possible to grow p-type III-V compound materials. When such over-saturation occurs, the level of acceptor impurity within the system must be lowered, for example by executing multiple material growth runs in the absence of acceptor impurities within the source tubes. Alternately, the reactor may be dismantled, cleaned, reassembled, and again pre-conditioned.

One of the advantages of the present invention is that a device structure, e.g., a p-n junction heterostructure, can be fabricated without requiring growth of low temperature buffer layers. In a conventional device comprised of III-V compound layers grown using MOCVD or a similar technique, a buffer layer must be grown on the surface of the substrate prior to growing epitaxial layers of the III-V nitride based compound. The buffer layer, typically consisting of AlN, GaAlN, or GaN, is grown at a temperature less than that required for the epitaxial layer to be formed. By growing the buffer layer at a low temperature, typically between 200° and 900° C., and more typically between 400° and 800° C., a polycrystalline layer is formed. When the substrate temperature is increased to approximately 1000° C. in order to grow the epitaxial layers, the buffer layer becomes partially monocrystalline, serving as a seed crystal for the epitaxial layers. Accordingly, as a consequence of this additional layer, conventional III-V device fabrication techniques require additional processing steps.

The present invention does not require the additional processing steps described above since a low temperature buffer layer is not required between the substrate and the epitaxial layers. As previously noted, according to the invention the first semiconductor layer of the desired device, for example an n-type GaN layer, is grown directly on the substrate without requiring that the substrate initially be maintained at a lower temperature to allow buffer layer growth. For example, according to the invention the first semiconductor layer is grown at a temperature preferably greater than 900° C., more preferably greater than 950° C., and still more preferably greater than 1000° C. Consequently, the present invention allows both device structures and fabrication processes to be simplified due to the elimination of the low temperature buffer layer.

Light Emitting Structures

The following structures are meant to be illustrative, and not limiting, as to the invention. These structures are fabricated using the previously described HVPE processes, thus allowing III-V compound layers of the desired conductivity to be grown.

In order to fabricate light emitting structures, several related factors are considered. First, the light emitting layer is preferably doped with a suitable impurity (e.g., O, Si, Ge, or Sn) in order to improve the layer's light emission characteristics. Second, the design must insure that sufficient carriers are injected into the light emitting layer of the device to result in light emission. As a higher concentration of injected carriers will typically result in a device capable of operating at higher brightness levels, preferably the layer or layers injecting carriers into the light emitting layer are doped with suitable dopants such as Mg or Zn. Additionally, the inventors have found that co-doping, for example with Mg and O or Zn and O, can be used to achieve very high carrier concentrations.

In a homojunction device, carriers travel from the layer of high concentration to the layer of low concentration. As previously noted, increasing the ratio of carriers in the injecting layer(s) to that of the light emitting layer increases the achievable brightness level of a device. Accordingly, doping the light emitting layer to improve its light emission characteristics can adversely affect this ratio, thereby lowering the achievable brightness level. This problem can be further exacerbated in devices in which the intended light emitting layer is the p-type layer as this layer is already doped with various impurities (e.g., Mg or Zn) that result in an increased carrier concentration.

Although the present invention can be used to grow homojunction devices, in order to avoid the design limitations described above, preferably the invention is used to grow heterojunction devices utilizing wide band gap materials. By growing a wide band gap layer such as AlGaN immediately adjacent to a narrow band gap layer such as GaN, carriers are forced to travel from the wide band gap material to the narrow band gap material regardless of the carrier concentration ratio. Accordingly, greater design latitude is provided as the light emitting layer can be optimally doped without adversely affecting the device's output.

Structures 1 and 2

Figure 10:
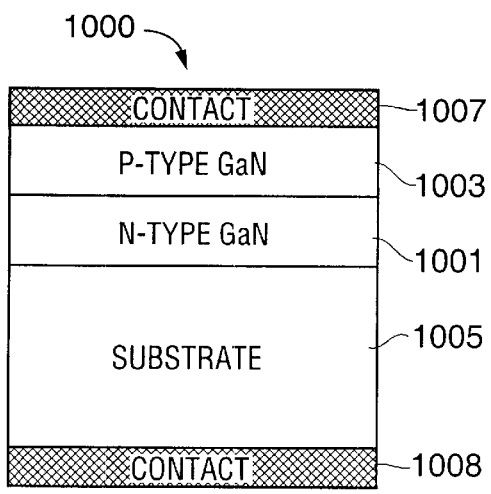
FIG. 10 illustrates a homojunction structure comprised of an n-type GaN layer and a p-type GaN layer.

Homojunction structure 1000 shown in FIG. 10 is comprised of an n-type GaN layer 1001 and a p-type GaN layer 1003. As shown, there is no intervening low temperature buffer layer between n-type GaN layer 1001 and substrate 1005. As previously described, preferably substrate 1005 is fabricated from Si or SiC. Contacts 1007 and 1008 are applied to the upper surface of p-type GaN layer 1003 and the lower surface of substrate 1005, respectively. Contacts 1007 and 1008 are comprised of a suitable material such as nickel (Ni), palladium (Pd), gold (Au), platinum (Pt), AuNi, or PdPt.

As previously described, the p-type layer is grown by doping the layer during growth with a suitable acceptor impurity. Preferably the acceptor impurity is comprised of Mg, Zn, or Mg+Zn although other acceptor impurities can be used. The n-type layer may contain small amounts of one or more donor impurities (e.g., oxygen (O), silicon (Si), germanium (Ge), and/or tin (Sn)). As described above, the carrier concentration ratio between layers 1001 and 1003 determines which of these layers serves as the light emitting layer.

Figure 11:
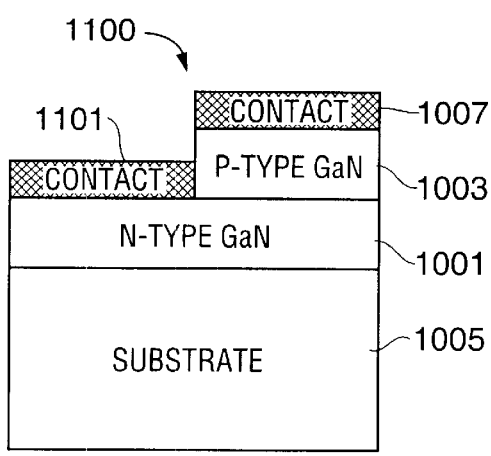
FIG. 11 illustrates a homojunction structure comprised of an n-type GaN layer and a p-type GaN layer utilizing a non-conductive substrate.

It will be understood that the above configuration assumes a conductive substrate, thereby allowing contact 1008 to be applied to the lower surface of the substrate. If an insulating substrate is used, for example one fabricated of $Al_2O_3$, a different contact arrangement must be used. For example, the structure shown in FIG. 11 is similar to that shown in FIG. 10 except for the location of one of the contacts. Specifically, a contact 101 is deposited on a portion of n-type GaN layer 1001. Preferably etching is used to create the mesa onto which contact 1101 is deposited.

It should be understood that the following structures assume a conductive substrate. The approach illustrated in FIG. 11 can be used, however, in these same structures when it is desirable to use a non-conductive substrate.

Structures 3–5

Figure 12:
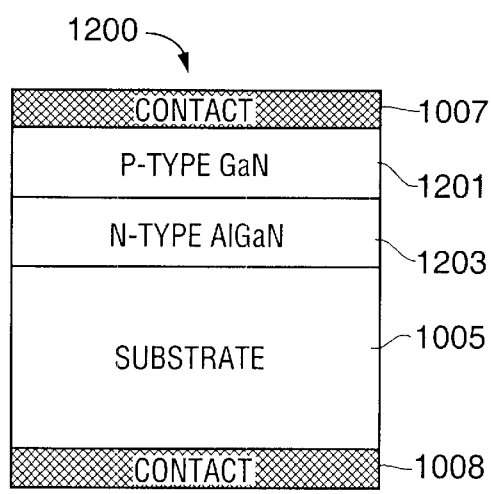
FIG. 12 illustrates a heterojunction structure comprised of an n-type AlGaN layer and a p-type GaN layer.
Figure 13:
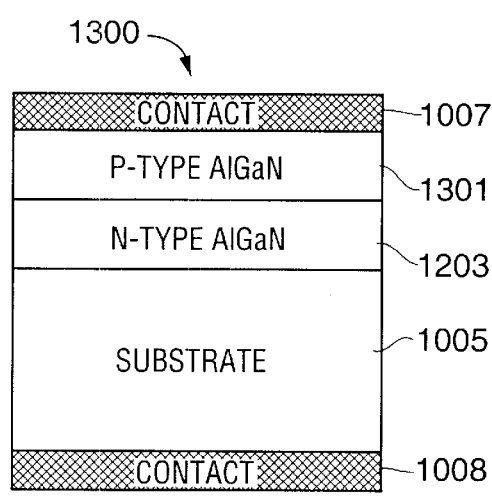
FIG. 13 illustrates a homojunction structure comprised of an n-type AlGaN layer and a p-type AlGaN layer.

FIG. 12 is an illustration of a heterojunction device 1200 utilizing a p-type GaN narrow band gap material 1201 and an n-type AlGaN wide band gap material 1203. The structure is grown directly onto substrate 1005 without inclusion of a low temperature buffer layer. Due to the use of a wide band gap material, carriers are injected by n-type AlGaN layer 1203 into light emitting layer 1201. In addition to doping layer 1201 with a suitable acceptor impurity as previously described, preferably layer 1201 is also doped with one or more dopants (e.g., Si) that improve the emission characteristics of the device. As previously described, the p-type layer is grown by doping the layer during growth with a suitable acceptor impurity. Preferably the acceptor impurity is comprised of Mg, Zn, or Mg+Zn although other acceptor impurities can be used. N-type layer 1203 is preferably doped with one or more donor impurities to improve the carrier concentration of the layer. It is understood that p-type GaN layer 1201 can be replaced with a p-type AlGaN layer 1301 as shown in FIG. 13. Device 1300, however, suffers from the same design constraints previously described with reference to GaN homojunction device 1000.

Figure 14:
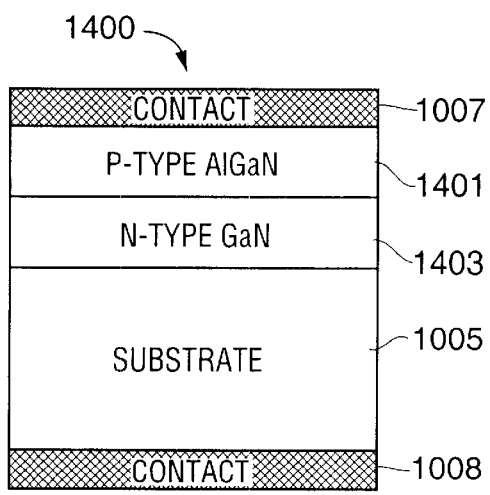
FIG. 14 illustrates a heterojunction structure comprised of an n-type GaN layer and a p-type AlGaN layer.

Device 1400, illustrated in FIG. 14, is similar to device 1200 except that the p-type layer is comprised of the wide band gap material (e.g., p-type AlGaN layer 1401) and the n-type layer is comprised of the narrow band gap material (e.g., n-type GaN layer 1403).

Structures 6 and 7

A problem inherent in structures 3–5 is the inefficient use of the carriers injected into the light emitting layer. Specifically, a portion of the injected carriers may pass through the light emitting layer into the adjoining layer or layers without causing light emission.

In order to overcome the above-identified problem, preferably the light emitting layer is sandwiched between two layers, both of which have a wider band gap than the light emitting layer. As a result of this configuration, the wide band gap material on either side of the light emitting layer prevent injected carriers from simply passing through the layer without being effectively used by the device. Accordingly, this device is more efficient than structures 3–5.

Figure 15:
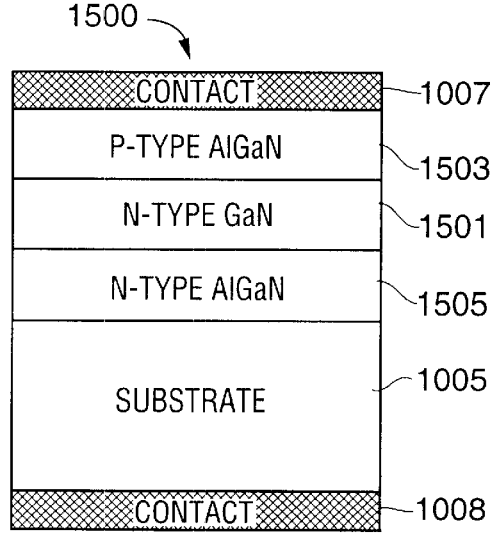
FIG. 15 illustrates a structure comprised of a narrow band gap material interposed between a pair of wide band gap materials.

FIG. 15 illustrates one embodiment of a device in which a narrow band gap material is interposed between a pair of wide band gap materials. It will be understood that this device is only meant to be illustrative of the described approach as other material combinations can be used without departing from the approach. As shown, device 1500 utilizes a light emitting layer 1501 comprised of n-type GaN interposed between a p-type AlGaN layer 1503 and an n-type AlGaN layer 1505. As previously noted, AlGaN has a wider band gap than GaN.

Figure 16:
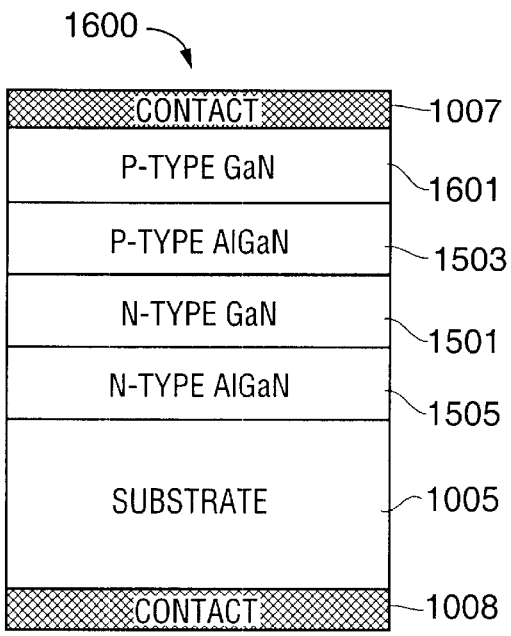
FIG. 16 illustrates a low voltage drop device similar to the structure shown in FIG. 15.

FIG. 16 illustrates a variation of device 1500. Device 1600 includes an additional layer 1601 interposed between p-type AlGaN layer 1503 and contact 1007. Layer 1601, included in order to achieve a low voltage drop device, is comprised of a narrow band gap material such as p-type GaN.

Structures 8–11

FIGS. 17–20 illustrate a various configurations of a device, all of which include a p-n homojunction interposed between layers of wide band gap material. As a p-n homojunction has inherently less crystal defects than a p-n heterojunction, this device is capable of achieving higher recombination efficiencies than a device based on a heterojunction.

Figure 17:
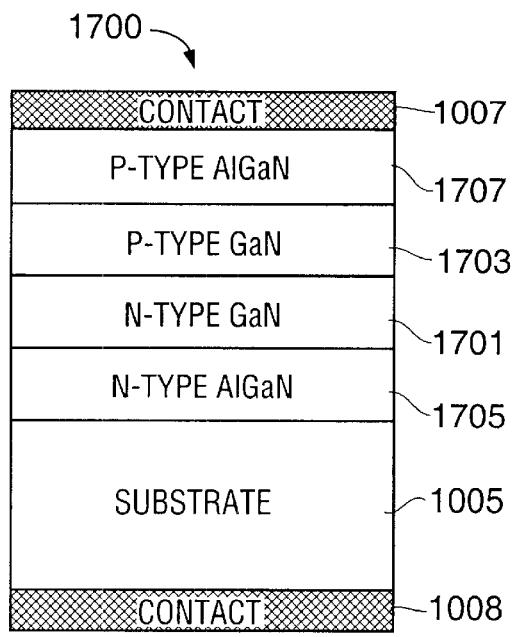
FIG. 17 illustrates a device comprised of a p-n homojunction interposed between a pair of wide band gap material layers.
Figure 18:
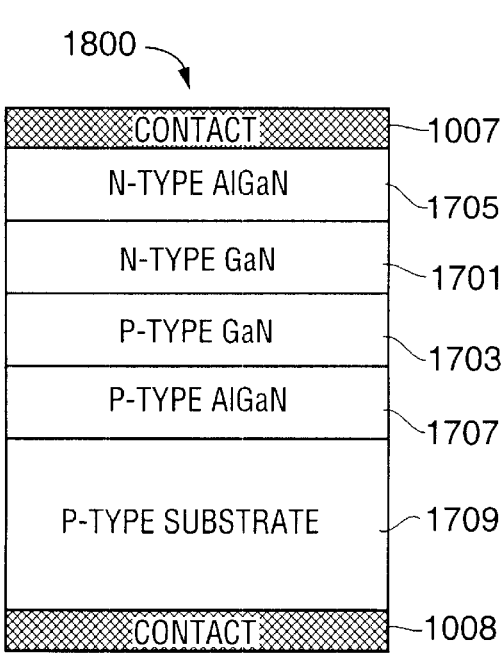
FIG. 18 illustrates an alternate device comprised of a p-n homojunction interposed between a pair of wide band gap material layers.

FIGS. 17 and 18 illustrate two configurations for this device, both utilizing a GaN p-n homojunction sandwiched between layers of AlGaN. The p-n homojunction is comprised of a layer 1701 of n-type GaN and a layer 1703 of p-type GaN. Adjacent to n-type GaN layer 1701 is a layer 1705 of n-type AlGaN. Adjacent to p-type GaN layer 1703 is a layer 1707 of p-type AlGaN. Additionally, device 1800 utilizes a p-type substrate 1709 (e.g., p-type SiC).

Figure 19:
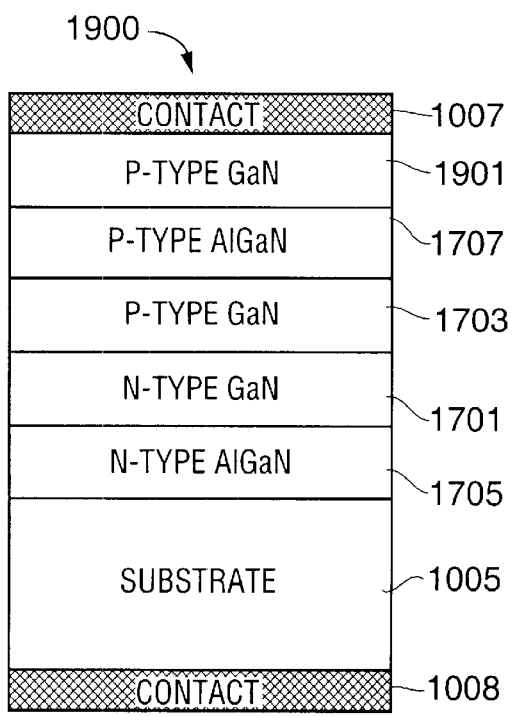
FIG. 19 illustrates yet another alternate device comprised of a p-n homojunction interposed between a pair of wide band gap material layers.

The device configurations illustrated in FIGS. 19 and 20 are the same as those shown in FIGS. 17 and 18 with the addition of a narrow band gap material layer (i.e., layers 1901 and 2001, respectively) interposed between the outermost wide band gap layer and contact 1007. As previously noted, the inclusion of such a layer is advantageous due to the low voltage drop incurred by the device.

It will be understood that the light emitting layer(s) of devices 1700–2000 can be comprised of layer 1701, layer 1703, or both layers 1701 and 1703, depending upon the dopants used with each layer.

Structures 12–15

FIGS. 21–24 illustrate various configurations of a device, all of which include a non-continuous quantum dot 'layer' 2101 within the device's p-n junction. As noted, layer 2101 is non-continuous, i.e., it is comprised of a plurality of 'islands', each of which is approximately the same size in all three dimensions. Accordingly, if layer 2101 is 20 Angstroms thick, typically each quantum dot region will be 20 Angstroms by 20 Angstroms by 20 Angstroms. In general, the majority of quantum dot regions are less than 30 Angstroms in each dimension. Preferably the majority of quantum dot regions are approximately 20 Angstroms by 20 Angstroms by 20 Angstroms.

Quantum dot layer 2101 is preferably comprised of $Al_xB_yIn_zGa_{1-x-y-z}N$. Preferably $0.01 \leq x+y \leq 0.2$. More preferably $0.01 \leq x+y \leq 0.03$ and $x+y+z \leq 0.2$. Even more preferably $0.01 \leq x+y \leq 0.03$ and $x+y+z \leq 0.15$.

In an alternate embodiment, quantum dot layer 2101 is comprised of $InGaN_{1-a-b}P_aAs_b$. Preferably $0.01 \leq a+b \leq 0.2$. More preferably $0.01 \leq a+b \leq 0.03$.

In an alternate embodiment, quantum dot layer 2101 is comprised of $Al_xB_yIn_zGa_{1-x-y-z}N_{1-a-b}P_aAs_b$. Preferably $0.01 \leq x+y \leq 0.2$ and $0.01 \leq a+b \leq 0.2$. More preferably $0.01 \leq x+y \leq 0.03$, $x+y+z \leq 0.2$, and $0.01 \leq a+b \leq 0.03$. Even more preferably $0.01 \leq x+y \leq 0.03$, $x+y+z \leq 0.15$, and $0.01 \leq a+b \leq 0.03$.

Preferably the process used to grow quantum dot layer 2101 is similar to the previously described processes except for the introduction of the additional elements during the layer's growth. If indium (In) is added, it is simultaneously heated with the Ga source, the In being heated to a temperature within the range of 750 and 850° C. After heating, $NE_3$ is introduced into the In source tube. The product of the reaction is delivered to the growth zone by the flow of Ar gas. If boron (B), phosphorous (P), or arsenic (As) are added to the quantum dot layer, they are introduced using gaseous sources.

As shown in FIGS. 21–24, quantum dot layer 2101 is sandwiched between a layer 2103 of n-type GaN and a layer 2105 of p-type GaN. Alternately, layer 2103 can be comprised of n-type InGaN and layer 2105 can be comprised of p-type InGaN. Adjacent to n-type GaN layer 2103 (or n-type InGaN) is a layer 2107 of n-type AlGaN. Adjacent to p-type GaN layer 2105 (or p-type InGaN) is a layer 2109 of p-type AlGaN. Additionally, devices 2200 and 2400 utilize p-type substrate 1709 (e.g., p-type SiC).

Figure 24:
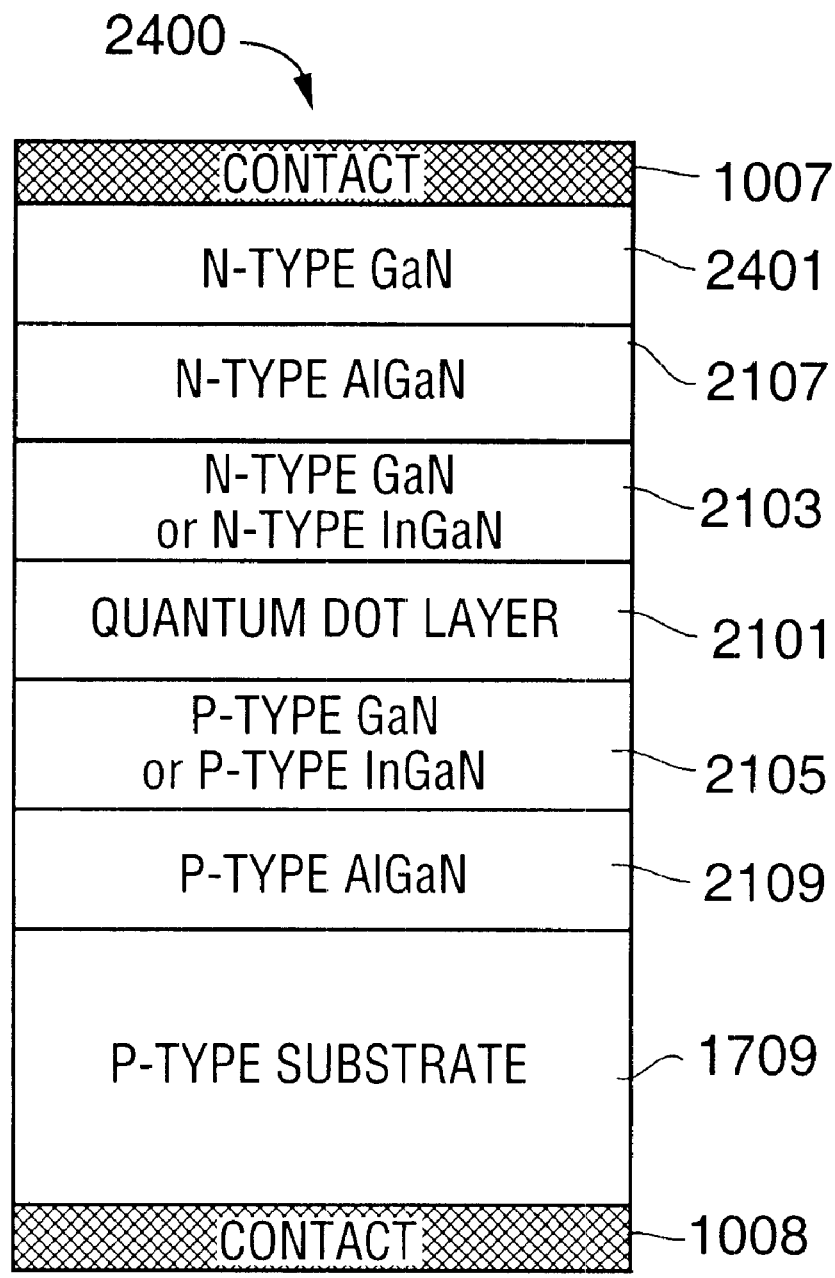
FIG. 24 illustrates yet another alternate device comprised of a non-continuous quantum dot layer within a device's p-n junction.

The device configurations illustrated in FIGS. 23 and 24 are the same as those shown in FIGS. 21 and 22 with the addition of a narrow band gap material layer (i.e., layers 2301 and 2401, respectively) interposed between the outermost wide band gap layer and contact 1007. As previously noted, the inclusion of such a layer is advantageous due to the low voltage drop incurred by the device.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A compound semiconductor device, comprising:
   a substrate;
   a first high temperature n-type III-V compound layer having a first band gap grown directly on said substrate, wherein said high temperature n-type III-V compound layer is grown at a temperature greater than 900° C. using HVPE techniques, wherein a low temperature buffer layer is not interposed between said substrate and said high temperature n-type III-V compound layer;
   a second n-type III-V compound layer having a second band gap grown on said first high temperature n-type III-V compound layer using HVPE techniques, wherein said first band gap is wider than said second band gap;
   a first p-type III-V compound layer having a third band gap grown on said second n-type III-V compound layer using HVPE techniques;
   a second p-type III-V compound layer having a fourth band gap grown on said first p-type III-V compound layer using HVPE techniques, wherein said fourth band gap is wider than said third band gap; and
   a non-continuous quantum dot layer comprised of a plurality of $Al_xB_yIn_zGa_{1-x-y-z}N$ quantum dot regions, said non-continuous quantum dot layer formed between said second n-type III-V compound layer and said first p-type III-V compound layer, wherein $0.01 \leq x+y \leq 0.2$.

2. The compound semiconductor device of claim 1, wherein said high temperature n-type III-V compound layer is grown at a temperature greater than 950° C. using HVPE techniques.

3. The compound semiconductor device of claim 1, wherein said high temperature n-type III-V compound layer is grown at a temperature greater than 1000° C. using HVPE techniques.

4. The compound semiconductor device of claim 1, wherein $0.01 \leq x+y \leq 0.03$ and $x+y+z \leq 0.2$.

5. The compound semiconductor device of claim 1, wherein $0.01 \leq x+y \leq 0.03$ and $x+y+z \leq 0.15$.

6. The compound semiconductor device of claim 1, wherein a majority of said plurality of $Al_xB_yIn_zGa_{1-x-y-z}N$ quantum dot regions are less than 30 Angstroms in width, length, and thickness.

7. The compound semiconductor device of claim 1, wherein a majority of said plurality of $Al_xB_yIn_zGa_{1-x-y-z}N$ quantum dot regions are approximately 20 Angstroms by 20 Angstroms by 20 Angstroms.

8. The compound semiconductor device of claim 1, further comprising:
   a first contact deposited on said second p-type III-V compound layer; and
   a second contact deposited on said substrate.

9. The compound semiconductor device of claim 8, wherein said first and second contacts are selected from the group of materials consisting of nickel, palladium, gold, platinum, gold-nickel, and palladium-platinum.

10. The compound semiconductor device of claim 1, further comprising a third p-type III-V compound layer having a fifth band gap grown on said second p-type III-V compound layer using HVPE techniques, wherein said fourth band gap is wider than said fifth band gap.

11. The compound semiconductor device of claim 10, further comprising:
    a first contact deposited on said third p-type III-V compound layer; and
    a second contact deposited on said substrate.

12. The compound semiconductor device of claim 11, wherein said first and second contacts are selected from the group of materials consisting of nickel, palladium, gold, platinum, gold-nickel, and palladium-platinum.

13. The compound semiconductor device of claim 1, wherein said substrate is selected from the group of materials consisting of sapphire, silicon carbide, gallium nitride, and silicon.

14. The compound semiconductor device of claim 1, wherein said first and second p-type III-V compound layers include at least one acceptor impurity metal selected from the group of metals consisting of Mg, Zn, and MgZn.

15. The compound semiconductor device of claim 14, wherein a concentration of said at least one acceptor impurity metal within said first and second p-type III-V compound layers is in the range of $10^{18}$ to $10^{21}$ atoms cm$^{-3}$.

16. The compound semiconductor device of claim 14, wherein a concentration of said at least one acceptor impurity metal within said first and second p-type III-V compound layers is in the range of $10^{19}$ to $10^{20}$ atoms $cm^{-3}$.

17. The compound semiconductor device of claim 14, wherein said first and second p-type III-V compound layers are co-doped with O.

18. The compound semiconductor device of claim 10, wherein said third p-type III-V compound layer includes at least one acceptor impurity metal selected from the group of metals consisting of Mg, Zn, and MgZn.

19. The compound semiconductor device of claim 18, wherein a concentration of said at least one acceptor impurity metal within said third p-type III-V compound layer is in the range of $10^{18}$ to $10^{21}$ atoms $cm^{-3}$.

20. The compound semiconductor device of claim 18, wherein a concentration of said at least one acceptor impurity metal within said third p-type III-V compound layer is in the range of $10^{19}$ to $10^{20}$ atoms $cm^{-3}$.

21. The compound semiconductor device of claim 18, wherein said third p-type III-V compound layer is co-doped with O.

22. The compound semiconductor device of claim 1, wherein said second n-type III-V compound layer includes at least one donor impurity selected from the group of materials consisting of O, Si, Ge, and Sn.

23. The compound semiconductor device of claim 1, wherein said first high temperature n-type III-V compound layer is comprised of AlGaN.

24. The compound semiconductor device of claim 1, wherein said second n-type III-V compound layer is comprised of GaN or InGaN.

25. The compound semiconductor device of claim 1, wherein said first p-type III-V compound layer is comprised of GaN or InGaN.

26. The compound semiconductor device of claim 1, wherein said second p-type III-V compound layer is comprised of AlGaN.

27. The compound semiconductor device of claim 10, wherein said third p-type III-V compound layer is comprised of GaN.

28. A compound semiconductor device, comprising:
   a p-type substrate;
   a first high temperature p-type III-V compound layer having a first band gap grown directly on said substrate, wherein said high temperature p-type III-V compound layer is grown at a temperature greater than 800° C. using HVPE techniques, wherein a low temperature buffer layer is not interposed between said substrate and said high temperature p-type III-V compound layer;
   a second p-type III-V compound layer having a second band gap grown on said first high temperature p-type III-V compound layer using HVPE techniques, wherein said first band gap is wider than said second band gap;
   a first n-type III-V compound layer having a third band gap grown on said second high temperature p-type III-V compound layer using HVPE techniques;
   a second n-type III-V compound layer having a fourth band gap grown on said first n-type III-V compound layer using HVPE techniques, wherein said fourth band gap is wider than said third band gap; and
   a non-continuous quantum dot layer comprised of a plurality of $Al_xB_yIn_zGa_{1-x-x-z}N$ quantum dot regions, said non-continuous quantum dot layer formed between said second high temperature p-type III-V compound layer and said first n-type III-V compound layer, wherein $0.01 \leq x+y \leq 0.2$.

29. The compound semiconductor device of claim 28, wherein said high temperature p-type III-V compound layer is grown at a temperature greater than 900° C. using HVPE techniques.

30. The compound semiconductor device of claim 28, wherein said high temperature p-type III-V compound layer is grown at a temperature greater than 950° C. using HVPE techniques.

31. The compound semiconductor device of claim 28, wherein said high temperature p-type III-V compound layer is grown at a temperature greater than 1000° C. using HVPE techniques.

32. The compound semiconductor device of claim 28, wherein $0.01 \leq x+y \leq 0.03$ and $x+y+z \leq 0.2$.

33. The compound semiconductor device of claim 28, wherein $0.01 \leq x+y \leq 0.03$ and $x+y+z \leq 0.15$.

34. The compound semiconductor device of claim 28, wherein a majority of said plurality of $Al_xB_yIn_zGa_{1-x-y-z}N$ quantum dot regions are less than 30 Angstroms in width, length, and thickness.

35. The compound semiconductor device of claim 28, wherein a majority of said plurality of $Al_xB_yIn_zGa_{1-x-y-z}N$ quantum dot regions are approximately 20 Angstroms by 20 Angstroms by 20 Angstroms.

36. The compound semiconductor device of claim 28, further comprising:
   a first contact deposited on said second n-type III-V compound layer; and
   a second contact deposited on said substrate.

37. The compound semiconductor device of claim 36, wherein said first and second contacts are selected from the group of materials consisting of nickel, palladium, gold, platinum, gold-nickel, and palladium-platinum.

38. The compound semiconductor device of claim 28, further comprising a third n-type III-V compound layer having a fifth band gap grown on said second n-type III-V compound layer using HVPE techniques, wherein said fourth band gap is wider than said fifth band gap.

39. The compound semiconductor device of claim 38, further comprising:
   a first contact deposited on said third n-type III-V compound layer; and
   a second contact deposited on said substrate.

40. The compound semiconductor device of claim 39, wherein said first and second contacts are selected from the group of materials consisting of nickel, palladium, gold, platinum, gold-nickel, and palladium-platinum.

41. The compound semiconductor device of claim 28, wherein said p-type substrate is selected from the group of materials consisting of sapphire, silicon carbide, gallium nitride, and silicon.

42. The compound semiconductor device of claim 28, wherein said first high temperature p-type III-V compound layer and said second p-type III-V compound layer each include at least one acceptor impurity metal selected from the group of metals consisting of Mg, Zn, and MgZn.

43. The compound semiconductor device of claim 42, wherein a concentration of said at least one acceptor impurity metal within said first high temperature p-type III-V compound layer and said second p-type III-V compound layer is in the range of $10^{18}$ to $10^{21}$ atoms $cm^{-3}$.

44. The compound semiconductor device of claim 42, wherein a concentration of said at least one acceptor impurity metal within said first high temperature p-type III-V compound layer and said second p-type III-V compound layer is in the range of $10^{19}$ to $10^{20}$ atoms $cm^{-3}$.

45. The compound semiconductor device of claim 42, wherein said first high temperature p-type III-V compound layer and said second p-type III-V compound layer are co-doped with O.

46. The compound semiconductor device of claim 28, wherein said first n-type III-V compound layer includes at least one donor impurity selected from the group of materials consisting of O, Si, Ge, and Sn.

47. The compound semiconductor device of claim 28, wherein said first high temperature p-type III-V compound layer is comprised of AlGaN.

48. The compound semiconductor device of claim 28, wherein said second p-type III-V compound layer is comprised of GaN or InGaN.

49. The compound semiconductor device of claim 28, wherein said first n-type III-V compound layer is comprised of GaN or InGaN.

50. The compound semiconductor device of claim 28, wherein said second n-type III-V compound layer is comprised of AlGaN.

51. The compound semiconductor device of claim 38, wherein said third n-type III-V compound layer is comprised of GaN.

* * * * *

UNITED STATES PATENT AND TRADEMARK OFFICE
CERTIFICATE OF CORRECTION

PATENT NO.   : 6,479,839 B2
DATED        : November 12, 2002
INVENTOR(S)  : Nikolaev et al.

It is certified that error appears in the above-identified patent and that said Letters Patent is hereby corrected as shown below:

<u>Title page,</u>
Item [75], Inventors, should read as follows:
-- [75] Inventors:    Andrey E. Nikolaev --

Signed and Sealed this

Fourth Day of November, 2003

JAMES E. ROGAN
*Director of the United States Patent and Trademark Office*